United States Patent [19]

Stucker

[11] Patent Number: 4,649,337

[45] Date of Patent: Mar. 10, 1987

[54] PHASE LAG ADJUSTMENT IN ELECTRIC METER

[75] Inventor: Harold L. Stucker, Somersworth, N.H.

[73] Assignee: General Electric Company, Somersworth, N.H.

[21] Appl. No.: 711,718

[22] Filed: Mar. 14, 1985

[51] Int. Cl.$^4$ .................... G01R 11/02; H01F 21/06
[52] U.S. Cl. ..................... 324/138; 336/136
[58] Field of Search ............... 336/136, 132, 133; 324/138, 137, 107, 152

[56] References Cited

U.S. PATENT DOCUMENTS

| 764,253 | 7/1904 | Peloux | 324/138 |
| 2,849,680 | 8/1958 | Lenehan | 324/138 |
| 3,644,810 | 2/1972 | Lewus | 336/136 |
| 4,054,855 | 10/1977 | Schlotterbeck | 336/136 |

FOREIGN PATENT DOCUMENTS 972672  9/1959  Fed. Rep. of Germany ...... 324/138

Primary Examiner—Reinhard J. Eisenzopf
Assistant Examiner—Jose M. Solis
Attorney, Agent, or Firm—R. E. Brunson; T. R. Morrison

[57] ABSTRACT

A phase lag adjustment in an electric meter includes a single-turn loop of large cross section encircling substantially the entire flux generated in a voltage stator which interacts which the disk of the electric meter. A variable inductor, in series with the single-turn loop, changes the effective impedance of the single-turn loop thereby adjusting the phase angle of the flux produced by the voltage stator. The variable inductor consists of a small number of turns of copper having a large cross section within a cylindrical shell made of silicon steel. Threaded bushings at each end of the cylindrical shell accept an adjusting bolt from either direction to permit adjustment from either end of the variable inductor. The silicon-steel cylindrical shell is clamped directly over connecting tabs of the cylindrical shell without insulation therebetween. The high resistance of silicon steel can be ignored in parallel with the much lower resistance of the copper turns.

10 Claims, 5 Drawing Figures

PHASE LAG ADJUSTMENT IN ELECTRIC METER

BACKGROUND OF THE INVENTION

The present invention relates to electric meters and, more particularly, to apparatus for adjusting the phase lag of a voltage stator of an electric meter.

Conventional electro-mechanical electric meters employ a conductive metal disk rotated as the rotor of a small induction motor by interaction with fluxes generated by opposed voltage and current coils or stators. When the fluxes produced by the current and voltage stators are in quadrature, the rotational torque experienced by the disk is proportional to the voltage applied to the load multiplied by the current consumed by the load; that is, the power consumed by the load. Disk rotation is magnetically resisted in proportion to its rotational speed. Thus, the disk speed is proportional to the power consumed by the load. Each rotation of the disk represents a predetermined increment of energy consumed. The rotations of the disk are accumulated over time in a mechanical or electronic accumulator, or register, for billing purposes by the utility supplying the power.

The voltage stator conventionally includes a large number of turns of fine wire on a laminated core of silicon steel. Resistive losses in the windings and the core of the voltage stator tend to shift the phase angle of the flux developed by the voltage stator to a value different from the desired 90 degrees relative to the phase angle of the flux developed by the current stator. In addition, the reaction of the disk to flux produced by the voltage stator may differ from the reaction to flux produced by the current. Furthermore, resistive losses and disk reaction tend to shift the phase angle of the flux developed by the current stator.

It is conventional to provide a means for adjusting the phase angle of the flux developed by the voltage stator to produce the desired disk speed at rated load at a power factor of 0.5. One common method of performing this adjustment employs a conductive metallic plate in series with a one-turn loop through which the flux from the voltage stator must pass. The metallic plate includes a number of closely spaced holes separated by narrow webs. During final adjustment of the meter, some of the webs are cut apart to increase the path length of current flow through the metallic plate, and thereby increasing the resistance thereof.

The above adjustment technique suffers from several drawbacks. First, the adjustment is one which is necessarily performed during final factory adjustment and is not repeatable in the field. Second, the adjustment technique is labor intensive since a substantial time is consumed in testing and then cutting the webs. Third, only step adjustments are possible. Practically, only about 10 to 15 step adjustments are feasible. If a speed change per step of, for example, about 0.5 percent is desired, a total adjustment range of from about 5 to about 7.5 percent is possible. In some applications, it is desirable to provide both finer adjustment than 0.5 percent and greater range than 7.5 percent. Finally, once a web has been cut, there is no going back. That is, if the meter speed is overadjusted by the cutting of one or more webs in addition to those whose cutting is necessary to achieve the desired regulation, there is no practical method for backing off on the adjustment. Once a web is cut it remains cut, and the only alternative includes disassembly of the meter and replacement of the conductive plate with one which does not have cut webs. The adjustment procedure must then be repeated.

Other adjustment techniques include overcompensating the phase angle of the voltage stator and using a slide-wire variable resistance adjustment on the current stator. The need for doubling the amount of phase lag adjustment hardware entailed by this technique makes it less than ideal.

OBJECTS AND SUMMARY OF THE INVENTION

Accordingly, it is an object of the invention to provide a phase lag adjust for an electric meter which overcomes the drawbacks of the prior art.

It is a further object of the invention to provide a phase lag adjust for an electric meter which permits continuous adjustment over a substantial adjustment range.

It is a still further object of the invention to provide a phase lag adjust for a voltage stator of an electric meter which employs a single turn enclosing substantially the entire flux from by the voltage stator which interacts with the disk and a variable inductor in series with the single turn.

It is a still further object of the invention to provide a phase lag adjust for an electric meter having greater range, and continuous adjustment throughout the range, than is possible in meters of the prior art.

It is a still further object of the invention to provide a phase lag adjustment for an electric meter which employs a variable inductor. The inductance of the variable inductor is made relatively large by placing a coil of a few turns in an annular cavity formed between a cylindrical shell of silicon steel surrounding the coil and an adjusting bolt centered within the coil. The impedance is adjusted by adjusting the penetration of the adjusting bolt within the coil. As the impedance of the coil is varied, by adjustment of the adjusting bolt, the coil current is correspondingly varied thereby varying the phase angle of the flux.

It is a still further object of the invention to provide a phase lag adjustment for the voltage stator of an electric meter in which adjustment is selectably permitted from either side of the voltage stator in dependence upon the insertion of an adjusting screw into one end or the other of an inductor coil. This permits adjustment of identical voltage stators on the left, right or read of a polyphase electric meter from the front of the electric meter by selecting the end of the inductor coil into which the adjusting screw is fitted.

Briefly stated, the present invention provides a phase lag adjustment in an electric meter in which a single-turn loop of large cross section encircles substantially the entire flux generated in a voltage stator which interacts with the disk of the electric meter. A variable inductor, in series with the single-turn loop, changes the effective impedance of the single-turn loop and thereby adjusts the phase angle of the flux produced by the voltage stator. The variable inductor consists of a small number of turns of copper having a large cross section within a cylindrical shell made of silicon steel. Threaded bushings at each end of the cylindrical shell accept an adjusting bolt from either direction to permit adjustment from either end of the variable inductor. The silicon-steel cylindrical shell is clamped directly over connecting tabs of the cylindrical shell without insulation therebetween. The high resistance of silicon steel can be ignored in parallel with the much lower resistance of the copper turns.

According to an embodiment of the invention, there is provided a phase lag adjust for an electric meter, the electric meter being of a type having a voltage stator and a current stator aligned with each other on opposed sides of a rotatable disk, the voltage stator being of a type having an E-shaped core with a voltage stator coil disposed on a center leg thereof, comprising a phase lag adjustment loop at least partly encircling the center leg in a location effective to contain at least a substantial portion of a flux in the center leg, a variable inductor, the variable inductor including a coil in series with the phase lag adjustment loop, a cylindrical shell of a magnetic material enclosing the coil, first and second threaded bushings disposed in first and second ends of the cylindrical shell, axes of the first and second threaded bushings being aligned substantially with each other and with an axis of the coil, means for clamping the cylindrical shell to the first and second threaded bushings and a ferromagnetic threaded member threadably engageable selectably in either one of the first and second threaded bushings and adjustable along the axis of the coil whereby an inductance of the variable inductor is varied.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
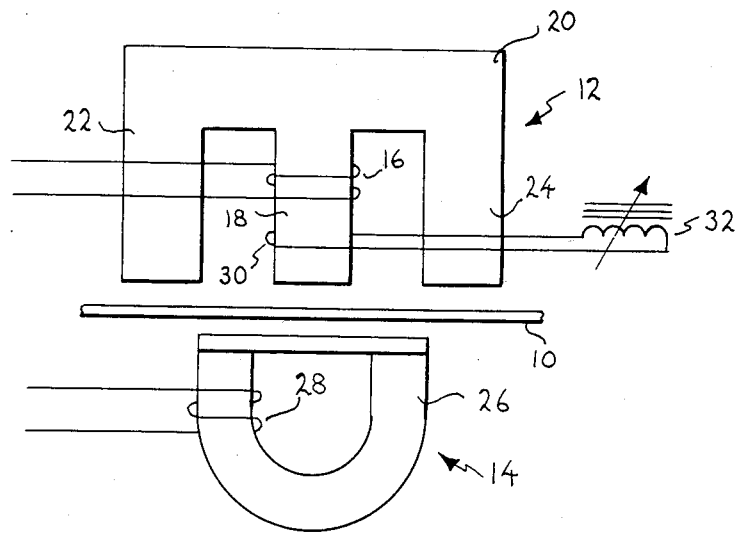
FIG. 1 is a simplified schematic diagram of a voltage stator of an electric meter containing a phase lag adjustment according to an embodiment of the invention.

Referring to FIG. 1, there is shown a voltage stator 12 and a current stator 14 aligned with each other on opposed sides of a rotatable disk 10, only a portion of which is shown. A voltage stator coil 16 is disposed on a center leg 18 of an E-shaped core 20, preferably of laminated construction. Disk 10 is exposed to the flux developed in center leg 18. Outer legs 22 and 24 of E-shaped core 20 provide a return path for flux to E-shaped core 20. Current stator 14 includes a current stator core 26 upon which is wound a current stator coil 28 consisting of a small number, commonly two or three, turns of a heavy gauge wire.

A one-turn phase lag adjustment loop 30 surrounds center leg 18 and thus encloses substantially all of the flux developed by voltage stator coil 16 which passes from center leg 18 to interact with disk 10. Phase lag adjustment loop 30 is connected in series with a variable inductor 32.

The voltage produced in phase lag adjustment loop 30 is determined by the flux encompassed therein. The current in phase lag adjustment loop 30 is determined by this voltage divided by the impedance in the loop. The impedance is, of course, equal to the vector sum of the resistance and the inductance. The resistance of the closed loop through phase lag adjustment loop 30 and variable inductor 32 is assumed to be constant. Thus any impedance change relies on a change in the inductance of variable inductor 32.

Figure 2:
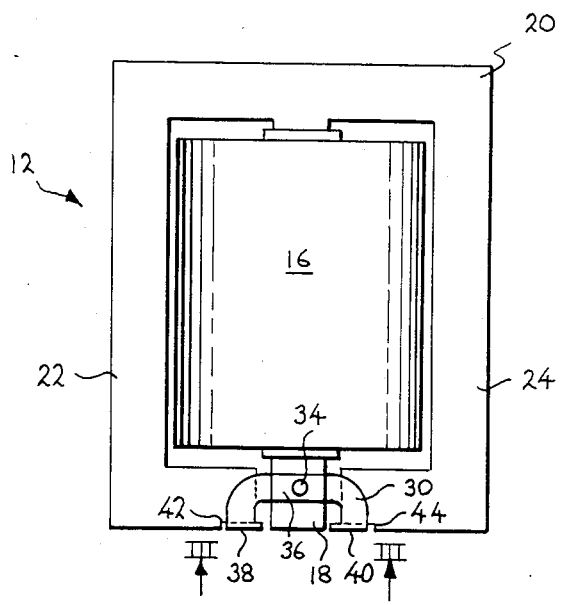
FIG. 2 is a rear view of a voltage stator according to an embodiment of the invention.
Figure 3:
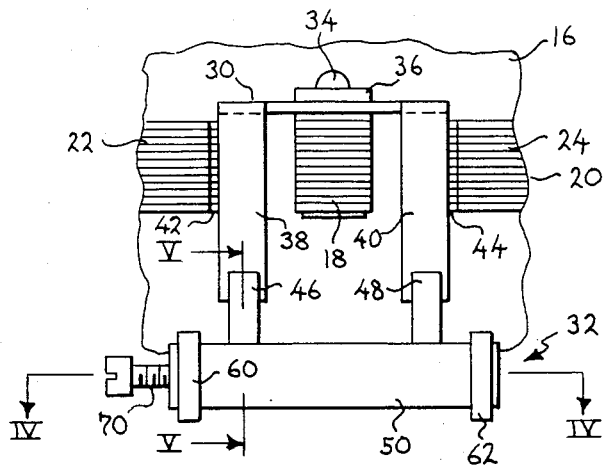
FIG. 3 is a bottom view of the voltage stator taken in the direction III—III in FIG. 2.

Referring now to FIG. 2, a portion of phase lag adjustment loop 30 is shown attached at a single point to center leg 18 by a stake 34. A temperature compensating reactor loop 36 is preferably employed to compensate for changes in resistance due to environmental temperature variations in adjustment loop 30 and in stator coil 16. Referring now also to the bottom view in FIG. 3, horizontal bars 38 and 40 pass from back to front of E-shaped core 20 in clearances provided by grooves 42 and 44 in the bottom surfaces of outer legs 22 and 24. Connecting tabs 46 and 48 of variable inductor 32 are welded to ends of horizontal bars 38 and 40, respectively. As noted above, the current in phase lag adjustment loop 30 is inversely proportional to the vector sum of resistance and inductance. The cross sections of phase lag adjustment loop 30 and variable inductor 32 are selected to provide a total resistance which sets the nominal value of impedance of this circuit in the center of the desired range when the inductance of variable inductor 32 is in the center of its range. This permits a substantial range of adjustment on both sides of the nominal value to accommodate normal manufacturing tolerances. Although some resistances are necessary in phase lag adjustment loop 30 and variable inductor 32 to set the nominal operating point of the combination, the total resistance is quite small. Thus, phase lag adjustment loop 30 and variable inductor 32 are necessary made of a highly conductive material, such as, for example, copper.

Figure 4:
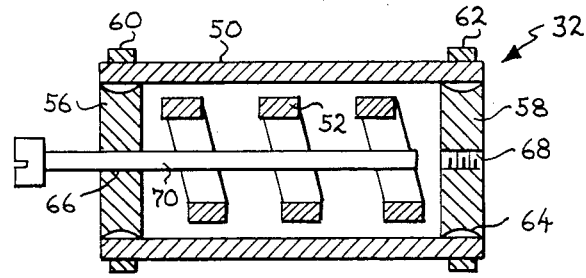
FIG. 4 is an axial cross section of a variable inductor taken along IV—IV in FIG. 3.
Figure 5:
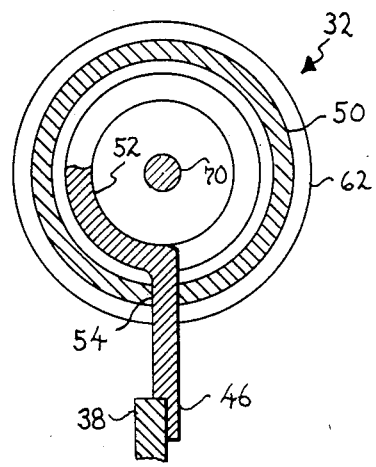
FIG. 5 is a transverse cross section of the variable inductor taken along V—V in FIG. 3.

Referring now also to FIGS. 4 and 5, a cylindrical shell 50, preferably of silicon steel, surrounds a coil 52 having a small number of closely spaced helical turns. The ends of coil 52 pass through cylindrical shell 50 to form connecting tabs 46 and 48. Coil 52 and connecting tabs 46 and 48 are made of a highly conductive material such as, for example, copper, and include as large a cross section as possible to minimize the resistance thereof.

A pair of ferromagnetic threaded bushings 56 and 58, one in each end of cylindrical shell 50, provide the cylindrical shape of cylindrical shell 50. A shrunk-fit ring 60 about cylindrical shell 50, in alignment with the perimeter of threaded bushing 56, secures one end of cylindrical shell 50 to threaded bushing 56. Similarly, a shrunk-fit ring 62 about cylindrical shell 50, aligned with the perimeter of threaded bushing 58, secures the second end of cylindrical shell 50. A concave perimeter 64 preferably is provided on threaded bushings 56 and 58 so that, when shrunk-fit rings 60 and 62 are shrunk into place, the intervening material of cylindrical shell 50 is compressed therein to provide additional security, and to provide secure and stable retention of threaded bushings 56 and 58 in correct axial alignment. Threaded axial holes 66 and 68 in threaded bushings 56 and 58 respectively, accept an adjusting bolt 70. Thus, adjusting bolt 70 can be installed for adjustment from either side of variable inductor 32. A single design of variable inductor 32 therefore is adaptable to use in any location in an electric meter with threaded axial hole 66 accessible for adjustment from the front of the electric meter by merely selecting the end of variable inductor 32 into which adjusting bolt 70 is installed.

The number of turns in coil 52 is a tradeoff between a number sufficient to attain a satisfactory adjustment range, and a number small enough that the resistance therein remains low enough to avoid swamping out the inductance changes. If more than five or six turns are used in coil 52, for example, the increased resistance in the extra electrical path requires a substantial increase in the cross-sectional area. If less than two turns are used, it becomes difficult to obtain a sufficient change in inductance. Thus, the preferred embodiment employs from about two to about six turns and the most preferred embodiment employs three turns. Three turns appear to give a satisfactory adjustment range of about 15 percent of disk speed at rated load and 50 percent power factor. The amount of inductance and the change in inductance are both enhanced by the presence of cylindrical shell 50, threaded bushings 56 and 58 and adjusting bolt 70. As adjusting bolt 70 penetrates further along the axis of the coil 52 toward the opposite end of the interior, the above elements more nearly approach a completed magnetic circuit about coil 52.

Adjusting bolt 70 has an adjustment range of from about full length within cylindrical shell 50 to about one-half withdrawn. Over this range, a substantially linear relationship is obtained between rotation of adjusting bolt 70 and change in disk speed.

In the preferred embodiment, cylindrical shell 50 is a rolled sheet clamped tightly over coil 52 without intervening insulation. Such clamping rigidly ties all elements of variable inductor 32 into a unitary assembly. The resistance of the silicon steel from which cylindrical shell 50 is made is so much higher than the resistance of the copper of which coil 52 is made that direct electrical and mechanical contact between cylindrical shell 50 and connecting tabs 46 and 48 have a negligible effect on the resulting resistance of variable inductor 32 and can be ignored.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A phase lag adjust for an electric meter, said electric meter being of a type having a voltage stator and a current stator aligned with each other on opposed sides of a rotatable disk, said voltage stator being of a type having an E-shaped core with a voltage stator coil disposed on a center leg thereof, comprising:
   a phase lag adjustment loop at least partly encircling said center leg in a location effective to contain at least a substantial portion of a flux in said center leg;
   a variable inductor;
   said variable inductor including a coil in series with said phase lag adjustment loop;
   a cylindrical shell of a magnetic material enclosing said coil;
   first and second threaded bushings disposed in first and second ends of said cylindrical shell;
   axes of said first and second threaded bushings being substantially aligned with each other and with an axis of said coil;
   means for clamping said cylindrical shell to said first and second threaded bushings; and
   a ferromagnetic threaded member threadably engageable selectably in either one of said first and second threaded bushings and adjustable along said axis of said coil whereby an inductance of said variable inductor is varied.

2. A phase lag adjustment according to claim 1 wherein said coil includes from about two to about six turns.

3. A phase lag adjust according to claim 2 wherein said coil includes three turns.

4. A phase lag adjust according to claim 1 wherein said cylindrical shell is a sheet of ferromagnetic material formed to fit over said coil.

5. A phase lag adjust according to claim 4 wherein said sheet of ferromagnetic material includes a slot through which project first and second connecting tabs of said coil.

6. A phase lag adjust according to claim 5 wherein said means for clamping includes means for compressing said cylindrical shell into rigid mechanical contact with said coil, whereby said variable inductor is rigidly secured in a unitary assembly.

7. A phase lag adjust according to claim 6 wherein a direct electrical contact is provided between said slot and said portions of said connecting tabs passing therethrough, said sheet of ferromagnetic material having a resistance high enough with respect to the resistance of said coil that a shunting resistance of said cylindrical shell across said coil is negligible.

8. A phase lag adjust according to claim 4 wherein said means for clamping includes first and second shrunk-fit rings over said cylindrical shell and generally aligned with perimeters of said first and second threaded bushings within said cylindrical shell.

9. A phase lag adjust according to claim 8 wherein said perimeters contacting said cylindrical shell are concave, and said shrunk-fit rings are effective at least partly to deform a portion of said cylindrical shell toward said concave perimeters whereby rigid security of said first and second threaded bushings within said cylindrical shell is retained.

10. A phase lag adjust according to claim 1 wherein said coil and said phase lag adjustment loop include a resistance therein which, in combination with an inductance of said variable inductor, is effective to establish a nominal impedance of said phase lag adjust in a predetermined position within its operational range when said ferromagnetic threaded member is in a center of its range.

* * * * *